(12) United States Patent
Enescu et al.

(10) Patent No.: US 11,516,059 B2
(45) Date of Patent: Nov. 29, 2022

(54) CLIPPED SIGNAL PULSE RESTORATION AFTER DELIBERATE PEAK CLIPPING

(71) Applicant: NXP USA, Inc., Austin, TX (US)

(72) Inventors: Andrei Alexandru Enescu, Bucharest (RO); Wim Joseph Rouwet, Austin, TX (US)

(73) Assignee: NXP USA, Inc., Austin, TX (US)

( * ) Notice: Subject to any disclaimer, the term of this patent is extended or adjusted under 35 U.S.C. 154(b) by 98 days.

(21) Appl. No.: 17/096,151

(22) Filed: Nov. 12, 2020

(65) Prior Publication Data

US 2021/0168009 A1    Jun. 3, 2021

(30) Foreign Application Priority Data

Nov. 28, 2019 (RO) .............................. a 2019 00817

(51) Int. Cl.
*H04L 27/26* (2006.01)
*H03M 1/08* (2006.01)

(52) U.S. Cl.
CPC ...... *H04L 27/2624* (2013.01); *H03M 1/0845* (2013.01)

(58) Field of Classification Search
CPC . H03M 1/0845; H03M 1/129; H04L 27/2624; H04L 27/2647
See application file for complete search history.

(56) References Cited

U.S. PATENT DOCUMENTS

2004/0016552 A1    8/2004   Chen et al.
2017/0142518 A1*   5/2017   May ...................... H03G 3/007

OTHER PUBLICATIONS

Bibi et al.: "Equation-Method for correcting clipping errors in OFDM signals", Article in SpringerPlus • Jun. 2016, DOI: 10.1186/s40064-016-2413-0, pp. 1-12.
Cheng et al.: "Reduction of the Clipping Noise for OFDM/OQAM System", Communications and Network, 2013, 5, 394-397 http://dx.doi.org/10.4236/cn.2013.53B2072 Published Online Sep. 2013 (http://www.scirp.org/journal/cn), pp. 394-397.
Dahimene et al.: "A Simple Algorithm for the Restoration of Clipped Speech Signal", Informatica 32 (2008), pp. 183-188.
Dejardin et al.: "Comparison of iterative receivers mitigating the clipping noise of OFDM based systems", Published 2007, pp. 1-7.
(Continued)

*Primary Examiner* — Nader Bolourchi (57) ABSTRACT

Saturation of an A/D converter at a receiver is addressed by forcing a controlled clipping of a peak signal pulse in the analog domain and restoring the pulse using a digital algorithm within the receiver. An A/D converter saturates and clips the peak pulses in the signal. Saturated peaks are restored by an algorithm operating in a baseband digital signal processor that utilizes information related to the time intervals where clipping was applied, along with information associated with the portion of the pulse below the clipping threshold. The time interval information is available from the A/D converter or through use of a separate pulse clipping detection algorithm. Through the use of embodiments of the present invention, the effect of signal clipping on receiver performance is reduced and therefore allows for increased clipping of the received signal.

18 Claims, 5 Drawing Sheets

(56) References Cited

OTHER PUBLICATIONS

Kollar et al.: "Iterative Signal Reconstruction of Deliberately Clipped SMT Signals", Article in Sciece China. Information Sciences • Feb. 2014, DoOI: 10.1007/s11432-013-4921-7, pp. 1-15.
Laguna et al.: "An Efficient Algorithm for Clipping Detection and Declipping Audio", 141st Convention of the Audio Engineering Society, Sep. 2016, pp. 1-10.
Sehgal et al.: "OFDM-PAPR Reduction using Statistical Clipping and Window based Noise Filtering", IJCEM International Journal of Computational Engineering & Management, vol. 17 Issue 2, Mar. 2014 ISSN (Online): 2230-7893 www.IJCEM.org, pp. 1-9.

* cited by examiner

CLIPPED SIGNAL PULSE RESTORATION AFTER DELIBERATE PEAK CLIPPING

CROSS-REFERENCE TO RELATED APPLICATIONS

This application claims the priority under 35 U.S.C. § 119 of Romania application no. A201900817, filed on 28 Nov. 2019, the contents of which are incorporated by reference herein.

BACKGROUND

Field

This disclosure relates generally to orthogonal frequency division multiplexing, and more specifically, to handling analog-to-digital converter input saturation power level signals at a receiving node.

Related Art

Orthogonal Frequency Division Multiplexing (OFDM) has gained in popularity in the past two decades thanks to robustness against multi-path channel interference caused by multiple reflections that occur on the radio channel of an over-the-air interface or on a cable. An OFDM waveform breaks the channel into multiple quasi-independent subchannels centered on subcarriers. The subcarriers are orthogonal and the quadrature amplitude modulation (QAM) symbols that modulate each subcarrier can be recovered at the receiving end, avoiding interference from neighbor subcarriers. Recent releases of the 3GPP specifications for 5G-NR and IEEE specifications for Wi-Fi employ OFDM.

One drawback of OFDM is a high peak-to-average power ratio. Since each subcarrier has independent modulation, it can frequently happen that, for some moments in time, a significant number of subcarriers are co-summed in phase, which can cause a large peak in a time-domain signal to be transmitted over a power amplifier. Such peaks, depending on a number of subcarriers, modulation patterns, and the like, can fall in a range of 8-12 dB with respect to an average power level of the transmitted signal. A receiver node, including an analog-to-digital converter (A/D converter) therein, should be designed such that the input saturation power level can accommodate these peak signal levels. For a Zero Intermediate Frequency receiver, in which a baseband signal is converted separately for a real part (e.g., I/in-phase) and imaginary part (e.g., Q/quadrature), both A/D converters should be designed to accommodate the peaks of the signal parts. In a situation in which a signal peak exceeds a saturation voltage of the A/D converter, the converted signal will be clipped or distorted and parasitic amplitude and phase modulations can occur, thereby corrupting the signal and inflating spectrum leak.

Generally, issues associated with saturation are avoided by ensuring that signal peaks fall within a linear region of the A/D converter. But this forces the A/D converter to accommodate a high input power level, thereby making the A/D converter expensive to implement. It is therefore desirable to address scenarios in which saturation of the A/D converter can occur using less expensive components and additional processing to restore clipped signals.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention address saturation of an A/D converter at a receiver by forcing a controlled clipping of a peak signal pulse in the analog domain and restore the pulse using a digital algorithm within the receiver. Embodiments provide an A/D converter that saturates and clips the peak pulses in the signal. Saturated peaks are restored by an algorithm operating in a baseband digital signal processor that utilizes information related to the time intervals where clipping was applied, along with information associated with the portion of the pulse below the clipping threshold. The time interval information is available from the A/D converter or through use of a separate pulse clipping detection algorithm. Through the use of embodiments of the present invention, the effect of signal clipping on receiver performance is reduced and therefore allows for increased clipping of the received signal.

Embodiments restore clipped pulses based on reconstructing the clipped waveform by maximizing "smoothness" of the signal. Each pulse is modeled as a polynomial function. Embodiments detect the presence of a clipped pulse and then estimate the coefficients of a polynomial such that the smoothness of the signal is maximum at the edges of the pulse and the function exhibits a peak within the interval of the clipped pulse. In addition, phase continuity is preserved at the extreme points of the interval. Once the coefficients are obtained, the problem then is reduced to solving a linear equation system, for which a vector programmable processor can be highly efficient.

Figure 1:
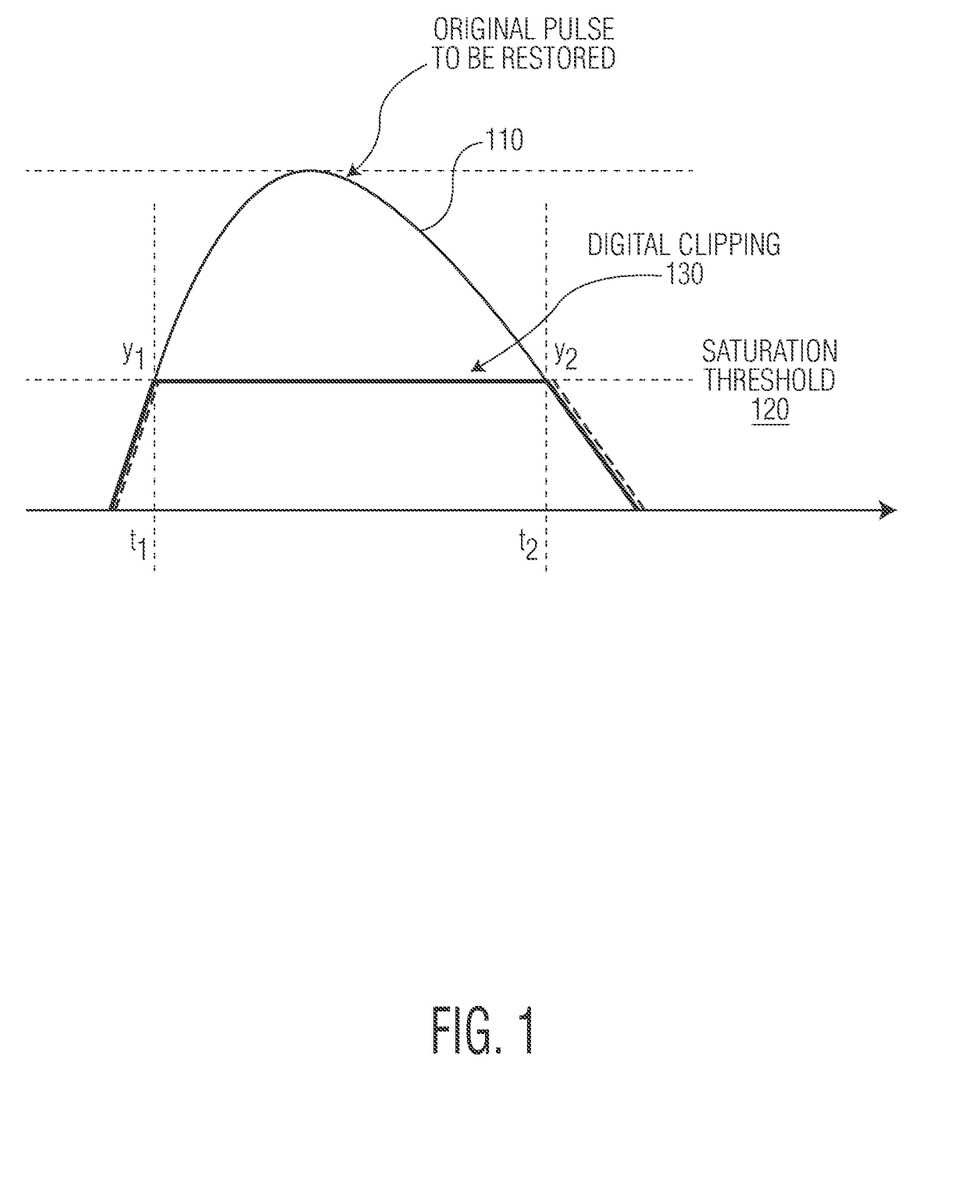
FIG. 1 is a diagram illustrating an example of a clipping effect on a saturated signal.

FIG. 1 is a diagram illustrating an example of a clipping effect on a saturated signal. An original pulse 110 has a magnitude in excess of a saturation threshold 120 of an A/D converter in a receiver of a signal containing the pulse. At time $t_1$, the pulse exceeds saturation threshold 120 and, at time $t_2$, the pulse falls below the saturation threshold. Between times $t_1$ and $t_2$, the A/D converter clips the digital signal at the saturation threshold. Embodiments of the present invention seek to re-create the original pulse digitally through the use of information regarding the converted pulse in the region surrounding times t1 and t2 (e.g., magnitude, slope, and other derivatives).

Figure 2:
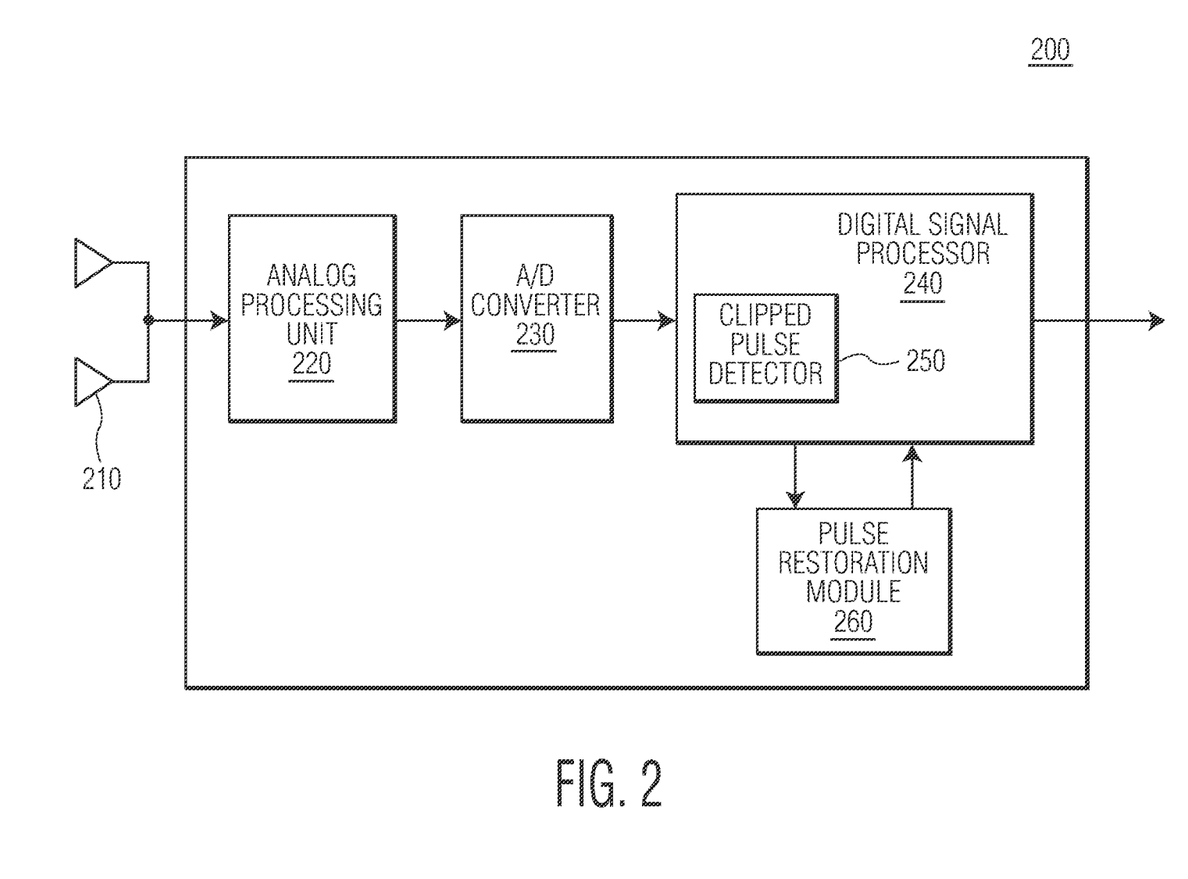
FIG. 2 is a simplified block diagram illustrating an example of a receiver 200 configured to restore a clipped signal pulse in accord with embodiments of the present invention.

FIG. 2 is a simplified block diagram illustrating an example of a receiver 200 configured to restore a clipped signal pulse in accord with embodiments of the present invention. An OFDM signal is received at antenna array 210, which is then provided to an analog processing unit 220.

Analog processing unit 220 can perform a variety of operations on the incoming signal, including, for example, beamforming operations combining signals received over a plurality of antennas within antenna array 210. Once the analog processing operations have been performed, the received signal is provided to A/D converter 230, which is configured to convert the received analog signal to a digital representation of that signal. As illustrated in FIG. 1, if a peak of a pulse in the received analog signal is greater than a saturation threshold of A/D converter 230, the A/D converter will clip a portion of the pulse above the saturation threshold in the digital representation of the signal.

The digital representation of the signal is provided to digital signal processor (DSP) 240 for further processing and manipulation. With regard to the clipped signal, initially the DSP determines whether a particular signal has a hallmark of having been clipped. This can be performed by a clipped pulse detector module 250, for example. A variety of mechanisms can be utilized to determine whether a pulse has been clipped. For example, the A/D converter can provide a signal in real time to the DSP when saturation is occurring, thereby identifying $t_1$ and $t_2$ for each pulse that has been clipped. In another example of clipped pulse detection, the DSP can examine groups of samples and, in a case where adjacent samples have similar values that are close to the saturation threshold, determine that a pulse existed and was clipped by the receiver's A/D converter. Alternatively, pulse detection can be performed by a windowing algorithm that measures variance of a group of adjacent samples and correlates that variance with an average magnitude. If the variance falls beneath a threshold and simultaneously the average magnitude exceeds a certain threshold, this can be indicative that pulse restoration should be applied. Embodiments of the present invention are not limited to any particular mechanism utilized for clipped pulse detection module 250.

Once a clipped pulse has been detected, pulse restoration module 260 performs operations to digitally restore the pulse to the original form of the pulse. It should be noted that, while pulse restoration module 260 is illustrated as external to DSP 240, the described functionality of the pulse restoration module can be performed by the DSP in certain applications.

Embodiments impose the following criteria to re-create the clipped pulse:
 the re-created pulse needs to maintain continuity of the signal seen as a mathematical function; and
 a position of the peak of the pulse is forced, since a pulse shape can be asymmetrical.

Embodiments of the present invention model the function to be estimated for the time interval under which clipping occurred as a constrained polynomial function $f$. The constraints placed upon the function are as follows:
 a) Function is polynomial
  The problem then translates to finding the set of polynomial coefficients.
  This is one solutions to the problem. Another can be to pre-store specific pulse shapes and use (dilate, crop) the one that fits best (this is not the solution utilized by embodiments of the present invention.
 b) The function is continuous at the extreme clipping points $$f(t_1)=y_1 \quad (1)$$

$$f(t_2)=y_2 \quad (2)$$

c) Derivatives in the extreme points are also continuous, which minimizes spectrum out-of-band emissions First order derivatives:

$$f'(t_1)=y'_1, \quad (3)$$

$$f'(t_2)=y'_2 \quad (4)$$

Second and greater order derivatives:

$$f^{(k)}(t_1)=y^{(k)}{}_1, f^{(k)}(t_3)=y^{(k)}{}_2$$

d) The function has a maximum extrema between the clipping boundaries
  The extrema is not necessarily equidistant to the boundaries of the clipping interval, but it is at a point proportionally closer to the boundary with the higher derivative $$f'\left(\frac{|y'_1|t_1 + |y'_2|t_2}{t_1 + t_2}\right) = 0 \quad (5)$$

With regard to (d), if a pulse is symmetrical, that is the derivatives at the boundaries are equal and of opposite sign, then the maximum will fall equidistant to the boundaries.

A polynomial is formed having as many unknown coefficients as the number of constraints that are imposed. Thus, if only derivatives of the first order are utilized in condition (c), then the polynomial will have an order of four $$f(t)=a_0+a_1t+a_2t^2+a_3t^3+a_4t^4$$

This results in a set of equations for the above of:

$$y_1 = a_0 + t_1 a_1 + t_1^2 a_2 + t_1^3 a_3 + t_1^4 a_4$$

$$y_2 = a_0 + t_2 a_1 + t_2^2 a_2 + t_2^3 a_3 + t_2^4 a_4$$

$$y'_1 = a_1 + 2t_1 a_2 + 3t_1^2 a_3 + 4t_1^3 a_4$$

$$y'_2 = a_1 + 2t_2 a_2 + 3t_2^2 a_3 + 4t_2^3 a_4$$

$$0 = a_1 + 2\left(\frac{|y'_1|t_1 + |y'_2|t_2}{t_1 + t_2}\right)a_2 + 3\left(\frac{|y'_1|t_1 + |y'_2|t_2}{t_1 + t_2}\right)^2 a_3 + 4\left(\frac{|y'_1|t_1 + |y'_2|t_2}{t_1 + t_2}\right)^3 a_4$$

A 5×5 matrix can be formed from this set of equations, which can then be pseudo-inverted and output a set of $a_k$ coefficients and hence the function $f$.

If condition (c), above, is applied until the nth order derivative, then the system rank is 2*n+3 (e.g., for the above example, the order is 2*1+3=5). As will be discussed in greater detail below, there is not a significant improvement in performance of the pulse restoration process by increasing the order of the polynomial beyond four, and hence keeping (c) to first order derivatives. With regard to condition (d), it has been determined that there is no significant degradation in the solution of the problem should one eliminate constraint (d). Thus, the order of the set of equations can be reduced by one.

Figure 3:
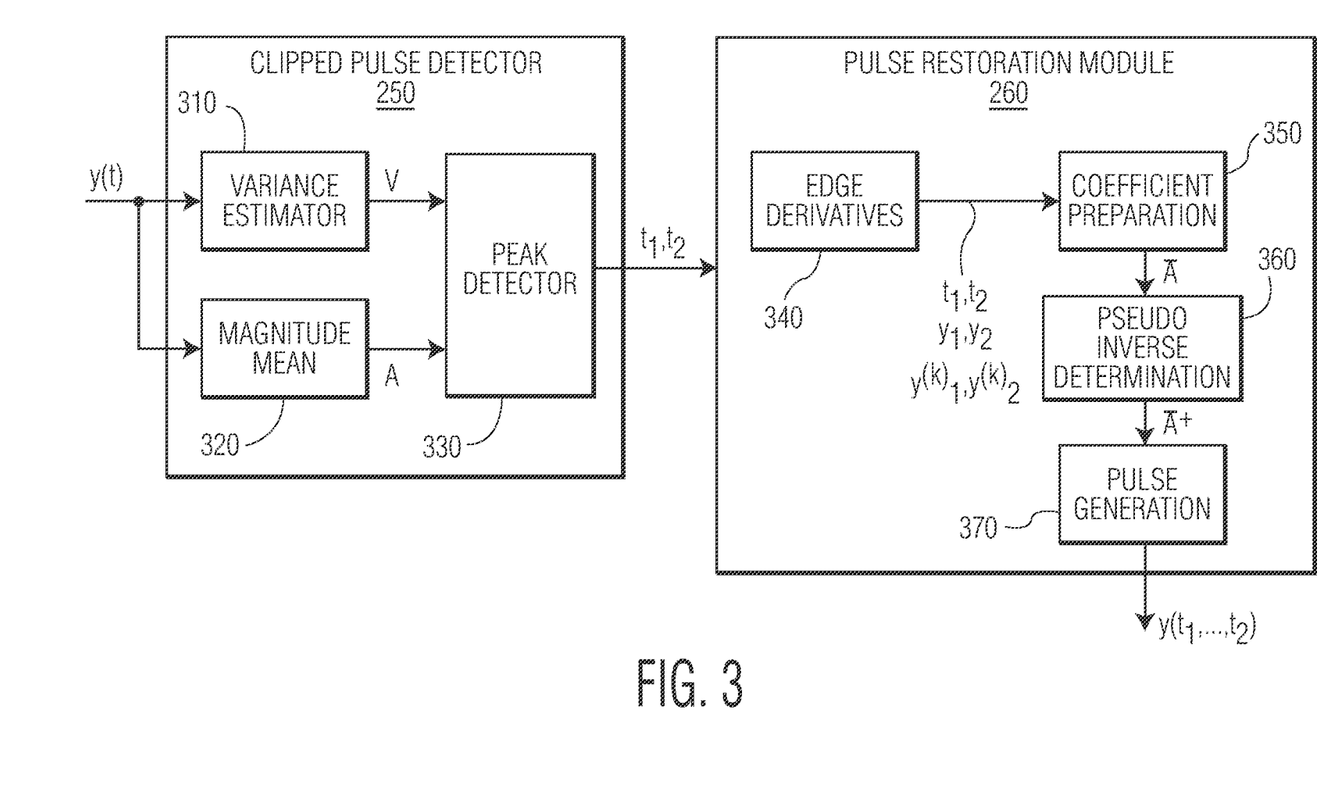
FIG. 3 is a simplified block diagram illustrating an example of a system configured to implement embodiments of the present invention.

FIG. 3 is a simplified block diagram illustrating an example of a system configured to implement embodiments of the present invention. As described above with regard to FIG. 2, a clipped pulse detector module 250 can perform operations related to detecting the presence of a clipped pulse in a digitized signal stream, and then a pulse restoration module 260 can perform operations related to forming a digital version of the restored clipped pulse. FIG. 3 illustrates additional details of the clipped pulse detector module 250 and pulse restoration module 260.

Clipped pulse detector module 250 receives as an input a digitized signal stream y(t). The digitized signal stream can be provided, for example, to a variance estimator module 310 and a magnitude mean module 320 in order to determine variances V and amplitudes A of the signal stream. This information can then be provided to a peak detector module 330 that can determine whether or not a clipped pulse peak is present in the signal stream in light of the variance and amplitude over time. As an output, clipped pulse detector 250 provides timestamps $t_1$ and $t_2$ to pulse restoration module 260 for further processing. Alternatively, an A/D converter providing the signal to the clipped pulse detector can also provide an indication of the times during which the signal is clipped due to saturation of the A/D converter. As discussed above, there are a variety of methods and mechanisms that can be utilized to determine the presence of a clipped signal peak in the digitized signal stream.

Pulse restoration module 260 is configured to perform operations associated with the polynomial generation and matrix manipulations discussed above. In one embodiment, pulse restoration module 260 can take the form of a programmable vector processor configured to perform various operations in an accelerated manner. As illustrated, pulse restoration module 260 incorporates an edge derivatives module 340 that can compute the higher order derivatives at the edges of the clipped pulse (e.g., times $t_1$ and $t_2$). A variety of numerical methods can be implemented by edge derivatives module 340 to compute the derivatives (e.g., 2- or 3-point derivatives). One method for estimating derivatives relies on the signal having an intrinsic redundancy that prevents the signal from varying too quickly, and therefore over a small increment of time, the derivatives can be generated from the following equations:

$$y'(t_1) = y(t_1) - y(t_1 - 1)$$

$$y'(t_2) = y(t_2 + 1) - y(t_2)$$

The edge derivatives module can then provide information such as t1, t2, y1, y2, y1($k$), y2($k$) to coefficient preparation module 350. The coefficient preparation module builds the linear system matrix, as shown above. For the above-discussed five-rank system, a linear system matrix takes the form of:

$$A = \begin{bmatrix} 1 & t_1 & t_1^2 & t_1^3 & t_1^4 \\ 1 & t_2 & t_2^2 & t_2^3 & t_2^4 \\ 0 & 1 & 2t_1 & 3t_1^2 & 4t_1^3 \\ 0 & 1 & 2t_2 & 3t_2^2 & 4t_2^3 \\ 0 & 1 & 2\left(\frac{|y'_1|t_1 + |y'_2|t_2}{t_1 + t_2}\right) & 3\left(\frac{|y'_1|t_1 + |y'_2|t_2}{t_1 + t_2}\right)^2 & 4\left(\frac{|y'_1|t_1 + |y'_2|t_2}{t_1 + t_2}\right)^3 \end{bmatrix}$$

This matrix can then be provided to pseudo-inverse determination module 360, which can generate, for example, a Moore-Penrose pseudo-inverse according to the following matrix manipulation equation (where $A^H$ is the Hermitian matrix of A):

$$A^+ = (A^H A)^{-1} A^H$$

Pulse generation module 370 can then compute the missing samples based on an estimated polynomial model that uses the pseudo-inverse matrix $A^+$:

$$a = \begin{bmatrix} a_0 \\ a_1 \\ a_2 \\ a_3 \\ a_4 \end{bmatrix} = A^+ \begin{bmatrix} y_1 \\ y_2 \\ y'_1 \\ y'_2 \\ 0 \end{bmatrix}$$

Where $f(t) = a_0 + a_1 t + a_2 t^2 + a_3 t^3 + a_4 t^4$, for $t = t_1 - t_2$. Thereby providing the function that models the clipped portion of the pulse.

Performance of the presently described method for restoring signal pulse can be assessed through an Error Vector Magnitude (EVM) estimation. Degradation of EVM is expected when a signal is saturated. The signal restoration process should at least partially compensate for the EVM loss.

Figure 4:
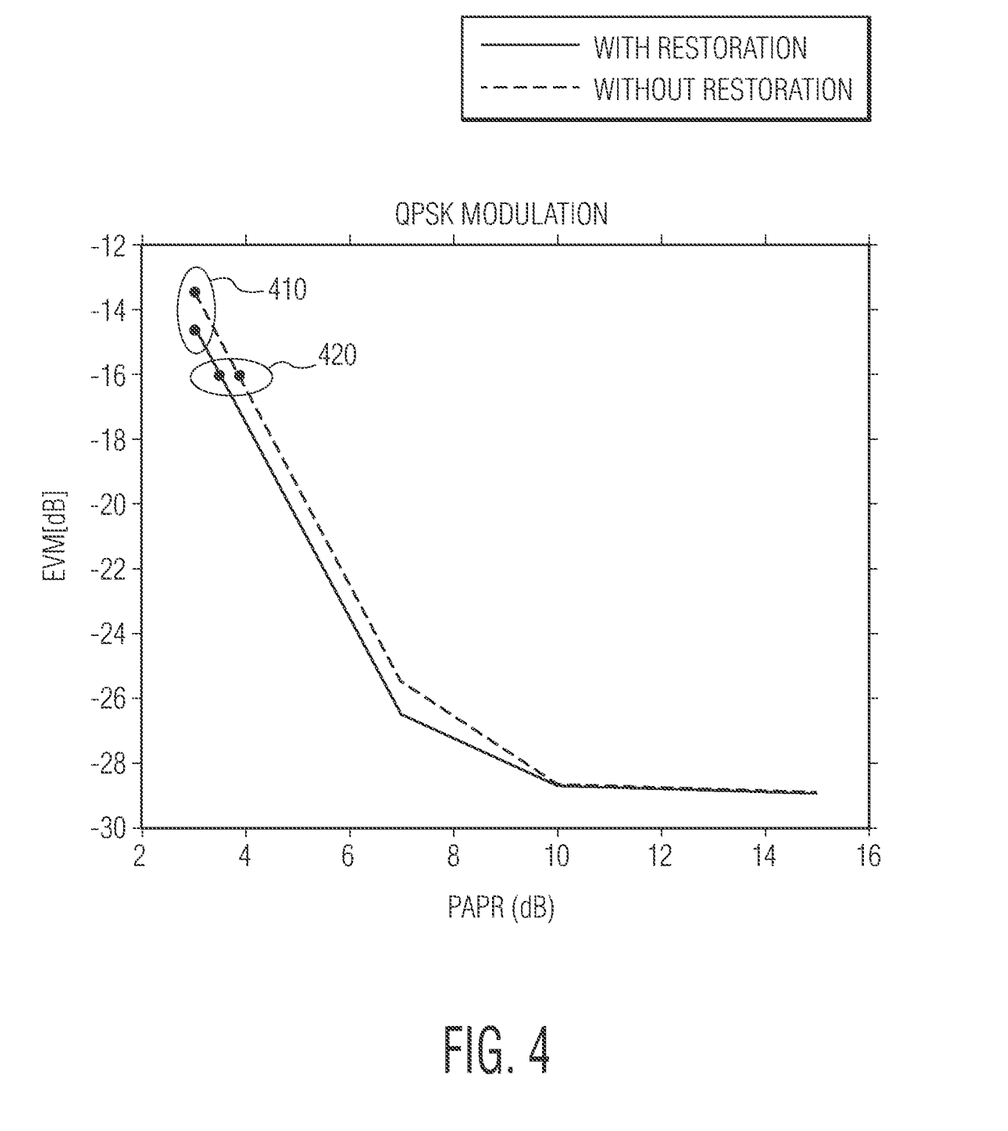
FIG. 4 is a chart illustrating an OFDM-QPSK modulation that applies clipping at various saturation levels both with and without the compensation method.

FIG. 4 is a chart illustrating an OFDM-QPSK modulation that applies clipping at various saturation levels both with and without the compensation method. The OFDM-QPSK modulation uses the following parameters:
  Number of total subcarriers=4096
  Number of QPSK modulated subcarriers=4000
  Oversampling factor=4
  Polynomial order=3 (four coefficients)
In addition, clipping is applied at saturation levels with respect to average received power (e.g., 1.5 dB, 3 dB, etc.).

The chart shows that at a fixed peak-to-average power ratio (PAPR), the restoration method provides a lower EVM by about 1.5 dB (e.g., 410). Alternatively, the chart also illustrates that at an imposed EVM for a given modulation (e.g., 16 dB for QPSK), the gain in PAPR is about 0.5 dB.

Figure 5:
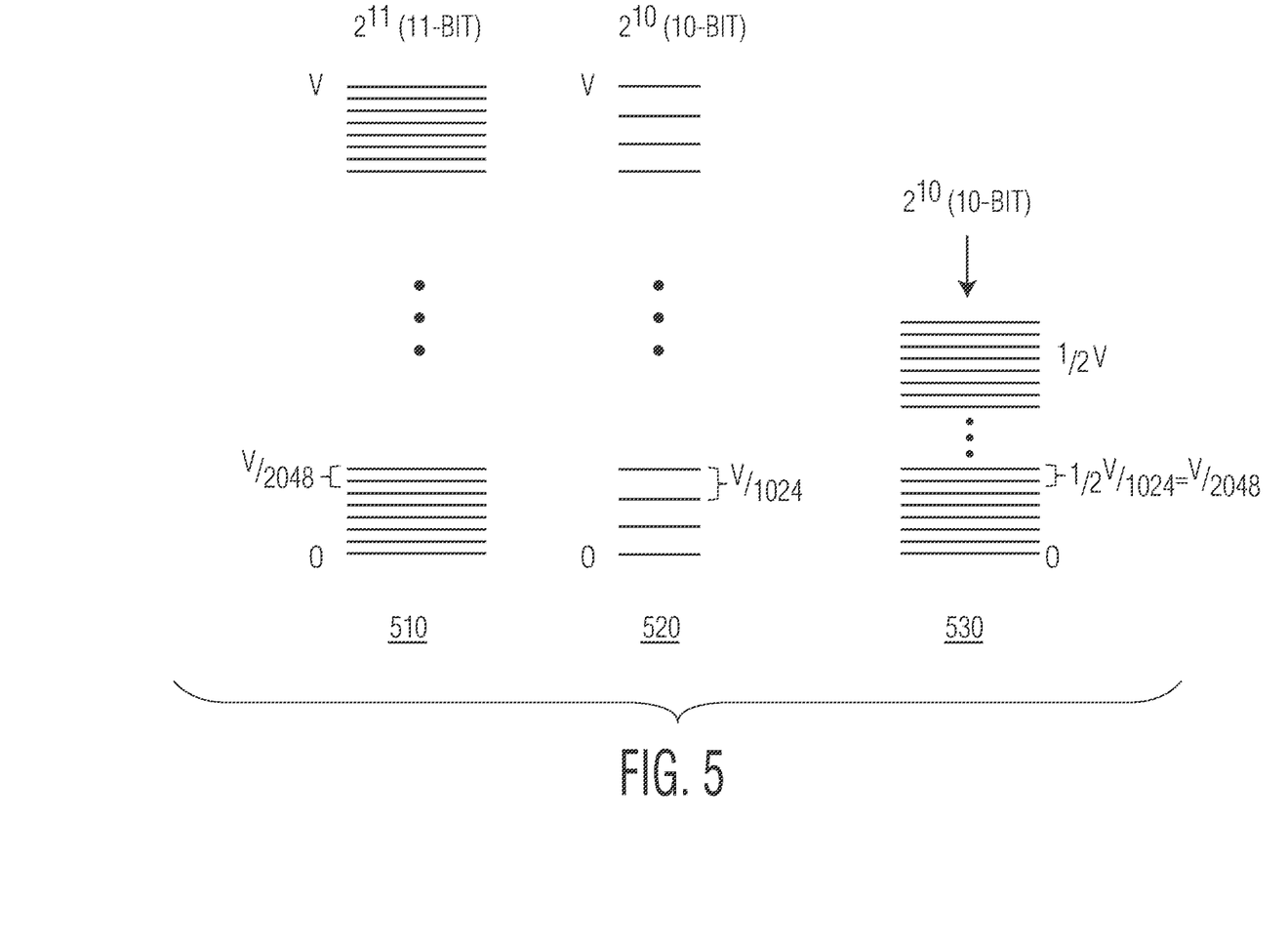
FIG. 5 illustrates resolution provided by both an 11-bit A/D converter and a 10-bit A/D converter in various scenarios, including those enabled by embodiments of the present invention.

Aside from an ability to restore clipped signal pulses, the mechanism for restoring clipped pulses may allow for the use of lower resolution, and therefore less expensive, A/D converters. This can be useful for certain signal shapes where PAPR is about 6 dB. FIG. 5 illustrates resolution provided by both an 11-bit A/D converter and a 10-bit A/D converter. An 11-bit A/D converter divides the voltage range into $2^{11}$ equal slots (i.e., V/2048) (510), while a 10-bit A/D converter divides the voltage range into $2^{10}$ equal slots (i.e., V/1024) (520). Thus, each slot for the 10-bit A/D converter is twice the size of the slots provided by the 11-bit A/D converter, resulting in half the resolution. If, however, the total voltage range of the 10-bit A/D converter were halved (e.g., ½ V) (530), then the each slot voltage range would be the same as that of the 11-bit converter over the full range ((½ V)/1024=V/2048). Signal pulses greater than ½ V could then be restored using the mechanisms discussed above.

Another advantage provided by using an A/D converter with fewer bits is that the signal-to-noise ratio (SNR) of the converter is reduced. Ideal SNR of an A/D converter is directly proportional to a number of bits of the converter (e.g., SNR (dB)=6.02*N+1.76 dB, where N=number of bits). Thus, reducing the number of bits provided by the converter also reduces the SNR of the converter. If, as above, a lower resolution converter is used to convert a smaller signal range than the a higher resolution converter, a similar signal range per bit can be achieve, while at the same time reducing the overall noise. As above, if a signal exceeds the selected voltage range, the pulse can be restored using the mechanisms discussed above. For example, an SNR of a clipped signal can be X. When the signal is restored to the original shape, the SNR is artificially increased by X+delta dB. Based upon simulations, the delta is about 0.5-1.0 dB.

Embodiments of the present invention provide a mechanism by which saturation of an A/D converter at a signal receiving node can be compensated for by digitally restoring clipped signals through fitting the know, clipped signal to a polynomial. Not only does this improve the integrity of the signal, but also allows for the use of less expensive A/D converters to provide similar resolution during conversion of usable signal, and also can improve signal-to-noise ratio of the converted signal.

By now it should be appreciated that there has been provided a method for restoring a clipped signal pulse by a receiving node. The method includes detecting a clipped signal pulse in a set of digitized signals, detecting first and second clipping points in time for the clipped signal pulse, and determining a function to restore the clipped signal pulse, where the function maintains continuity with the clipped signal pulse at the first and second clipping points and maintains continuity with derivatives of the clipped signal pulse at the first and second clipping points.

In one aspect of the above embodiment, detecting the clipped signal pulse includes receiving a second signal from an analog-to-digital (A/D) converter during a saturation event of the A/D converter causing the clipped signal pulse, where the second signal is indicative of the beginning and the end of the saturation event. In another aspect of the above embodiment, detecting the clipped signal pulse includes analyzing the set of digitized signals for a group of adjacent samples signals having similar values near a saturation level. In yet another aspect of the above embodiment, the first clipping point corresponds to a time in which an analog input signal rises above a saturation level for an A/D converter receiving the analog input signal, and the second clipping point corresponds to a time in which the analog input signal falls below the saturation level for the A/D converter.

In another aspect of the above embodiment, the function is a polynomial having a number of coefficients equal to a number of constraints imposed. In a further aspect, the constraints include a value of the clipped signal pulse at the first clipping point, a value of the clipped signal pulse at the second clipping point, a value of a first derivative of the clipped signal pulse at the first clipping point, and a value of a first derivative of the clipped signal pulse at the second clipping point. In yet a further aspect, the constraints further include one or more second or higher order derivatives of the clipped signal pulse at the first clipping point, and one or more second or higher order derivatives of the clipped signal pulse at the second clipping point. In another further aspect, the constraints further include forcing a maximum extrema between the first and second clipping points. In another further aspect, determining the function further includes forming a linear system matrix corresponding to a set of equations associated with the constraints, and generating a pseudo-inverse of the linear system matrix. In yet a further aspect, the method further includes computing missing portions of the clipped signal pulse using the function as estimated from the pseudo-inverse of the linear system matrix.

In another aspect of the above embodiment, the method further includes receiving an orthogonal frequency division multiplexing (OFDM) signal at antenna array of the receiving node, and generating the set of digitized signals using an A/D converter.

Another embodiment of the present invention provides a system configured to restore a clipped signal pulse. The system includes an analog-to-digital (A/D) converter configured to generate a set of digitized signals from an analog input signal where the set of digitized signals includes a clipped signal pulse, a first processor configured to detect first and second clipping points in time for the clipped signal pulse, and a second processor configured to determine a function that maintains continuity with the clipped signal pulse at the first and second clipping points and maintains continuity with derivatives of the clipped pulse at the first and second clipping points to restore the clipped signal pulse.

In one aspect of the above embodiment, the first processor is configured to detect the clipped signal pulse by being further configured to receive a second signal from the A/D converter during a saturation event of the A/D converter causing the clipped signal pulse, where the second signal is indicative of the beginning and the end of the saturation event. In another aspect of the above embodiment, the first processor is configured to detect the clipped signal pulse by being further configured to analyze the set of digitized signals for a group of adjacent samples signals having similar values near a saturation level. In another aspect, the first clipping point corresponds to a time in which the analog input signal rises above the saturation level for the A/D converter receiving the analog input signal, and the second clipping point corresponds to a time in which the analog input signal falls below the saturation level for the A/D converter.

In another aspect of the above embodiment, the function is a polynomial having a number of coefficients equal to a number of constraints imposed. In a further aspect, the constraints include a value of the clipped signal pulse at the first clipping point, a value of the clipped signal pulse of the second clipping point, a value of a first derivative of the clipped signal pulse at the first clipping point, and a value of a first derivative of the clipped signal pulse at the second clipping point. In another further aspect, the second processor is configured to determine the function by being further configured to form a linear system matrix corresponding to a set of equations associated with the constraints, and generate a pseudo-inverse of the linear system matrix. In yet a further aspect, the second processor is further configured to compute missing portions of the clipped signal pulse using the polynomial as estimated from the pseudo-inverse of the linear system matrix. In another further aspect, the second processor includes a programmable vector processor.

In another aspect of the above embodiment, the system further includes an antenna array that is coupled to the A/D converter and is configured to receive the analog input signal where the analog input signal includes an orthogonal frequency division multiplexing signal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIGS. 2 and 3 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 200, for example, from computer readable media. Such computer readable media may be permanently, removably or remotely coupled to an information processing system such as system 200. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for restoring a clipped signal pulse by a receiving node, the method comprising:
   detecting the clipped signal pulse in a set of digitized signals;
   detecting first and second clipping points in time for the clipped signal pulse; and
   determining a function to restore the clipped signal pulse, wherein the function maintains continuity with the clipped signal pulse at the first and second clipping points and maintains continuity with derivatives of the clipped signal pulse at the first and second clipping points.

2. The method of claim 1 wherein said detecting the clipped signal pulse comprises:
   receiving a second signal from an analog-to-digital (A/D) converter during a saturation event of the A/D converter causing the clipped signal pulse, wherein the second signal is indicative of the beginning and the end of the saturation event.

3. The method of claim 1, wherein
   the first clipping point corresponds to a time in which an analog input signal rises above a saturation level for an A/D converter receiving the analog input signal; and
   the second clipping point corresponds to a time in which the analog input signal falls below the saturation level for the A/D converter.

4. The method of claim 1 wherein the function is a polynomial having a number of coefficients equal to a number of constraints imposed.

5. The method of claim 4 wherein the constraints comprise:

a value of the clipped signal pulse at the first clipping point;

a value of the clipped signal pulse at the second clipping point;

a value of a first derivative of the clipped signal pulse at the first clipping point; and a value of a first derivative of the clipped signal pulse at the second clipping point.

6. The method of claim 5 wherein the constraints further comprise:

one or more second or higher order derivatives of the clipped signal pulse at the first clipping point; and one or more second or higher order derivatives of the clipped signal pulse at the second clipping point.

7. The method of claim 5 wherein the constraints further comprise:

forcing a maximum extrema between the first and second clipping points.

8. The method of claim 4 wherein said determining the function further comprises:

forming a linear system matrix corresponding to a set of equations associated with the constraints; and generating a pseudo-inverse of the linear system matrix.

9. The method of claim 8 further comprising:

computing missing portions of the clipped signal pulse using the function as estimated from the pseudo-inverse of the linear system matrix.

10. The method of claim 1 further comprising:

receiving an orthogonal frequency division multiplexing (OFDM) signal at an antenna array of the receiving node; and generating the set of digitized signals using an A/D converter.

11. A system configured to restore a clipped signal pulse, the system comprising:

an analog-to-digital (A/D) converter configured to generate a set of digitized signals from an analog input signal, wherein the set of digitized signals comprises clipped signal pulse;

a first processor configured to detect first and second clipping points in time for the clipped signal pulse; and a second processor configured to determine a function that maintains continuity with the clipped signal pulse at the first and second clipping points and maintains continuity with derivatives of the clipped pulse at the first and second clipping points to restore the clipped signal pulse.

12. The system of claim 11 wherein the first processor is configured to detect the clipped signal pulse by being further configured to receive a second signal from the A/D converter during a saturation event of the A/D converter causing the clipped signal pulse, wherein the second signal is indicative of the beginning and the end of the saturation event.

13. The system of claim 11, wherein the first clipping point corresponds to a time in which the analog input signal rises above a saturation level for the A/D converter receiving the analog input signal; and the second clipping point corresponds to a time in which the analog input signal falls below the saturation level for the A/D converter.

14. The system of claim 11 wherein the function is a polynomial having a number of coefficients equal to a number of constraints imposed.

15. The system of claim 14 wherein the constraints comprise:

a value of the clipped signal pulse at the first clipping point;

a value of the clipped signal pulse at the second clipping point;

a value of a first derivative of the clipped signal pulse at the first clipping point; and a value of a first derivative of the clipped signal pulse at the second clipping point.

16. The system of claim 14 wherein the second processor is configured to determine the function by being further configured to:

form a linear system matrix corresponding to a set of equations associated with the constraints;

generate a pseudo-inverse of the linear system matrix; and compute missing portions of the clipped signal pulse using the polynomial as estimated from the pseudo-inverse of the linear system matrix.

17. The system of claim 14 wherein the second processor comprises a programmable vector processor.

18. The system of claim 11 further comprising:

an antenna array, coupled to the A/D converter, and configured to receive the analog input signal wherein the analog input signal comprises an orthogonal frequency division multiplexing (OFDM) signal.

* * * * *